US009603224B2

United States Patent
Vonach

(10) Patent No.: US 9,603,224 B2
(45) Date of Patent: Mar. 21, 2017

(54) INTERFACE CIRCUIT FOR SIGNAL TRANSMISSION

(71) Applicant: Tridonic GmbH & Co KG, Dornbirn (AT)

(72) Inventor: Christoph Vonach, Dornbirn (AT)

(73) Assignee: TRIDONIC GMBH & CO KG, Dornbirn (AT)

( * ) Notice: Subject to any disclaimer, the term of this patent is extended or adjusted under 35 U.S.C. 154(b) by 0 days.

(21) Appl. No.: 14/655,900

(22) PCT Filed: Dec. 20, 2013

(86) PCT No.: PCT/AT2013/000210
§ 371 (c)(1),
(2) Date: Jun. 26, 2015

(87) PCT Pub. No.: WO2014/100843
PCT Pub. Date: Jul. 3, 2014

(65) Prior Publication Data
US 2015/0342009 A1 Nov. 26, 2015

(30) Foreign Application Priority Data
Dec. 28, 2012 (DE) .......................... 10 2012 224 515

(51) Int. Cl.
*H05B 37/02* (2006.01)
*H03K 19/0175* (2006.01)

(52) U.S. Cl.
CPC . *H05B 37/0254* (2013.01); *H03K 19/017536* (2013.01); *H05B 37/0272* (2013.01)

(58) Field of Classification Search
CPC H05B 37/02; H05B 37/0245; H05B 37/0254; H05B 37/0272; H03K 19/017536; H04M 1/745; H04L 25/26; H04L 25/028; H04L 25/085; H04L 12/40032
USPC ... 315/291, 292, 294, 307, 209 R, 312, 362, 315/289
See application file for complete search history.

(56) References Cited

U.S. PATENT DOCUMENTS

| | | | |
|---|---|---|---|
| 6,297,724 B1* | 10/2001 | Bryans et al. | H05B 37/0254 307/38 |
| 6,762,570 B1 | 7/2004 | Fosler | |
| 6,771,029 B2* | 8/2004 | Ribarich | H05B 37/0254 315/291 |

(Continued)

FOREIGN PATENT DOCUMENTS

| | | |
|---|---|---|
| CN | 101211329 A | 7/2008 |
| CN | 201681294 U | 12/2010 |

(Continued)

*Primary Examiner* — Haissa Philogene
(74) *Attorney, Agent, or Firm* — Volpe and Koenig, P.C.

(57) ABSTRACT

An interface circuit (1) is provided for an operating device (2) of the domestic appliance technology, in particular for an operating device for lighting means (3), for bi-directional communication with a bus (4) via a respective transmitting opto-coupler (9) and a receiving opto-coupler (8), wherein a node point (P) of the interface circuit (1) is impinged upon with a driver voltage (VT) in such a way that the transmitting opto-coupler (9) switches through and thus sends a signal to the bus (4), and wherein, at the same node point (P), the state of the receiving opto-coupler (8) can be detected so that a signal can be received from the bus (4).

14 Claims, 1 Drawing Sheet

(56) References Cited

U.S. PATENT DOCUMENTS

| | | | | |
|---|---|---|---|---|
| 7,598,510 | B2* | 10/2009 | Kuo | H04L 25/26 |
| | | | | 250/214 R |
| 7,741,785 | B2* | 6/2010 | Juen | H05B 37/0227 |
| | | | | 315/149 |
| 8,368,307 | B2* | 2/2013 | Cash | H05B 37/0272 |
| | | | | 315/149 |
| 8,694,817 | B2* | 4/2014 | Hoffknecht | G06F 1/26 |
| | | | | 323/233 |
| 8,810,148 | B2* | 8/2014 | Boeckle | H05B 37/02 |
| | | | | 315/119 |
| 2007/0285129 | A1 | 12/2007 | Hsieh | |
| 2008/0152063 | A1 | 6/2008 | Kuo | |
| 2013/0214601 | A1* | 8/2013 | Yang | H02J 1/00 |
| | | | | 307/43 |

FOREIGN PATENT DOCUMENTS

| | | |
|---|---|---|
| CN | 102724144 A | 10/2012 |
| DE | 4330114 A1 | 5/1994 |
| DE | 102005018762 A1 | 10/2006 |

\* cited by examiner

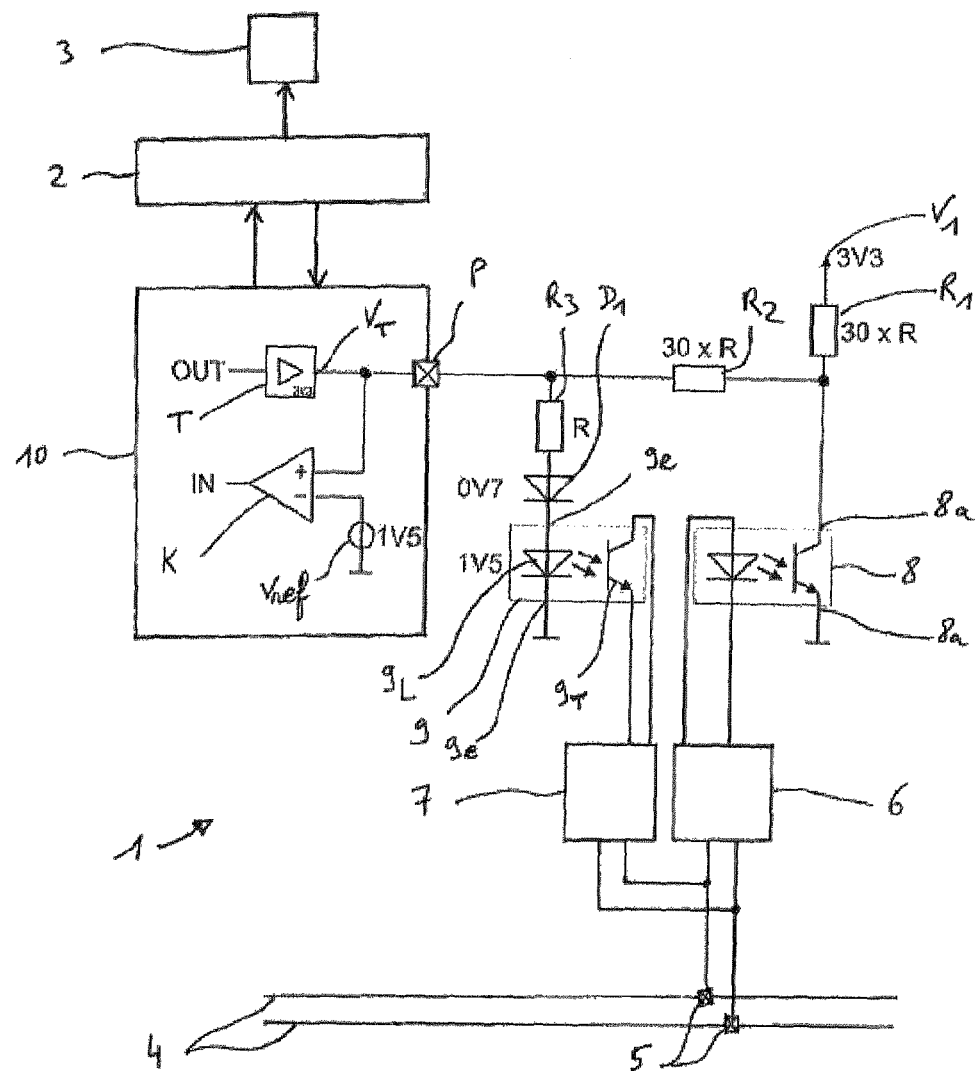

INTERFACE CIRCUIT FOR SIGNAL TRANSMISSION

FIELD OF THE INVENTION

The present invention relates to interfaces which can be used, for example, in connection with operating devices for operating lamps, for example ballasts. In particular, the invention relates to an interface circuit for transmitting data, in particular control commands, to an operating device for the lamp.

BACKGROUND

Interface circuits for bidirectionally transmitting data between an operating device for a lamp and a bus are fundamentally known. Such an interface is known, for example, from U.S. Pat. No. 6,762,570 B1. FIG. 4 of said document shows a circuit having two optocouplers for transmitting and receiving data. The bidirectional transmission is controlled by a microcontroller 102, this microcontroller having, on the one hand, connections for receiving data and, on the other hand, separate connections for transmitting data. In the operating device, a plurality of pins are assigned to the bidirectional communication on the intelligent circuit in the form of the microcontroller.

Accordingly, the aim of the invention is to provide a simplified interface circuit.

The object of the invention is achieved by the features of the appended independent claims. Advantageous refinements and developments of the invention emerge from the dependent claims.

SUMMARY

A first aspect of the invention relates to an interface circuit for an operating device in domestic appliance technology, in particular for an operating device for a lamp, for bidirectionally communicating with a bus via a respective transmission optocoupler and a reception optocoupler. A driver voltage can be applied to a node of the interface circuit in such a manner that the transmission optocoupler turns on and therefore transmits a signal to the bus. The state of the reception optocoupler can be detected at the same node, with the result that a signal can be received from the bus.

Another aspect of the invention relates to an operating device for a lamp, having such an interface circuit.

Another aspect of the invention relates to a control and evaluation circuit for an interface circuit for an operating device in domestic appliance technology, in particular for an operating device for a lamp, for bidirectionally communicating with a bus via a respective transmission optocoupler and a reception optocoupler. A driver voltage can be applied to a node of the control and evaluation circuit in such a manner that the transmission optocoupler turns on and therefore transmits a signal to the bus. The state of the reception optocoupler can be detected at the same node, with the result that a signal can be received from the bus. In this case, the control and evaluation circuit may be in the form of an integrated circuit, in particular an ASIC or a microcontroller or a hybrid version thereof.

A signal, in particular a digital signal, is transmitted to the bus as a result of the transmission optocoupler turning on. As a result of the fact that the state of the reception optocoupler can be detected, it is possible to receive the state of the bus and therefore to receive a signal from the bus.

The node may be a connection of a control and evaluation circuit.

The control and evaluation circuit may have a driver for applying a driver voltage to the node, wherein the driver voltage causes the transmission optocoupler to turn on.

The control and evaluation circuit may have means, for example a comparator, for comparing the voltage at the node with a reference voltage. A low-level signal or a high-level signal on the bus can be inferred on the basis of this comparison.

A low-level signal on the bus can be inferred if the voltage at the node is greater than the reference voltage. A high-level signal on the bus can be inferred if the voltage at the node is smaller than the reference voltage. The data transmitted via the interface may be transmitted both as an active high signal (that is to say a 1 is transmitted by means of a high level) and as an active low signal (that is to say a 1 is transmitted by means of a low level).

The bus may be in the form of a DALI bus. A detected high-level signal of the bus can be interpreted as a quiescent state of the bus.

The control and evaluation circuit may be in the form of an integrated circuit, preferably in the form of a microcontroller, an application-specific integrated circuit (ASIC) or a digital signal processor.

The interface circuit may have:
a first current path which is connected to the node (P) and has a low-impedance circuit (R3) and the transmission optocoupler (9),
a high-impedance second current path which is connected to the node (P), is supplied with a supply voltage (V1) and is connected to a reception optocoupler (8).

The reception optocoupler may be connected to the high-impedance second current path in such a manner that turning-on of the reception optocoupler causes a low potential at the node.

The reception optocoupler can be connected to the high-impedance second current path in such a manner that the absence of turning-on of the reception optocoupler causes a high potential at the node.

The reception optocoupler may be connected to the high-impedance second current path in such a manner that the absence of turning-on of the reception optocoupler causes the transmission optocoupler to not turn on.

The driver voltage, on the one hand, and a supply voltage coupled to the reception optocoupler, on the other hand, can be supplied to the transmission optocoupler.

The interface circuit may have an asymmetrical resistor network configured in such a manner that the transmission optocoupler turns on when the driver voltage is supplied and the transmission optocoupler does not turn on when the supply voltage is supplied.

If the driver voltage is not applied to the node, the transmission optocoupler is preferably not turned on and the control and evaluation circuit can detect the digital signal received via the reception optocoupler on the basis of the voltage produced at the node (P).

The invention is now aimed at only one pin being required for bidirectional data communication by means of two optocouplers, instead of two pins on the intelligent circuit (ASIC or microcontroller).

BRIEF DESCRIPTION OF THE DRAWINGS

Preferred exemplary embodiments of the invention are explained in more detail below with reference to the accompanying drawings.

FIG. 1 shows a schematic illustration of an interface circuit of high electric strength according to one exemplary embodiment of the present invention.

DETAILED DESCRIPTION OF THE PREFERRED EMBODIMENTS

FIG. 1 shows a bidirectional interface 1 according to the present invention. This interface 1 is used for bidirectional data interchange between an operating device 2 for a lamp or at least one lamp 3 and, for example, a remote control center or a further operating device (not shown) via a bus 4. The interface 1 contains a control circuit or a control and evaluation circuit 10 which connects the interface 1 to the operating device 2 and, in particular, enables bidirectional communication between the bus 4 and the operating device 2. The operating device 2 may be, in particular, an electronic ballast for a lamp. The lamp 3 may be, for example, an LED or OLED (organic light-emitting diode) lamp or also a halogen lamp or gas discharge lamp. The operating device 2 can also be generally used for domestic appliance technology for the purpose of controlling further electrical devices.

The interface 1 has connecting terminals 5 for the bus 4. The input of a reception channel or reception path 6 and the output of a transmission channel or transmission path 7 are combined at the connecting terminals 5. The interface 1 is able to receive data from the bus via the reception channel 6 and is able to transmit data to the bus via the transmission channel 7. The interface 1 or the operating device 2 receives data from the bus 4 via the reception channel 6 which is also referred to as the forward channel. The transmission channel 7 is the return channel, that is to say the channel which is used by the interface 1 or the operating device 2 to transmit data to the bus 4.

The received data may be, in particular, control commands for operating the lamp 3. The transmitted data may relate, for example, to information concerning the state of the lamp 3 or the operating device 2. The interchanged data preferably correspond to the DALI (Digital Addressable Lighting Interface) standard, a protocol for controlling lighting operating devices. Alternatively, the data may be in accordance with the DSI (Digital Signal Interface) protocol for controlling operating devices. The data on the bus 4 are preferably in digital form.

If the bus 4 is a DALI bus, for example, as is used in the field of lighting technology, a first signal level may correspond to a physical low level having a voltage range of −4.5 V to +4.5 V, whereas a second signal level may be assigned to a high level having a voltage range of +9.5 V to +22.5 V, that is to say 16 V or between −9.5 V and −22.5 V, for example. In the case of a DALI bus system, data are fundamentally transmitted in such a manner that, if one bit is transmitted, the voltage on the bus 4 is pulled to zero volts or at least approximately zero volts, whereas, in the quiescent state, that is to say if no bit is transmitted, a bus voltage in the voltage range of 9.5 to 22.5 V, that is to say 16 V or between −9.5 V and −22.5 V, for example, is applied. Data are therefore transmitted by means of a low level in a DALI bus system. Alternatively or additionally, data may also be transmitted by means of a high level, as is the case in the DSI protocol, for example.

An optocoupler or reception optocoupler 8 which is used for potential isolation is connected to the output of the reception channel 6. A further optocoupler or transmission optocoupler 9 is connected to the input of the transmission channel 7. Alternatively, the reception optocoupler 8 and the transmission optocoupler 9 are directly connected to the bus 4.

The reception optocoupler 8 and the transmission optocoupler 9 are configured to enable bidirectional data interchange between the control circuit 10 and the bus system and therefore between the operating device 2 and the bus system. For example, the reception optocoupler 8 may therefore be configured to transmit information such as control commands, which are applied to the bus 4, to the control circuit 10 and on to the operating device 2. On the other hand, the operating device 2 may in turn output data, for example state information, to the control circuit 10 which supplies these data to the transmission channel 7 via the transmission optocoupler 9 and finally transmits them to the bus system. The control circuit 10 may convert analog data received from the operating device 2, for example, into digital signals, for example DALI or DSI signals, and can supply them to the transmission channel 7.

The control circuit 10 is preferably in the form of an integrated circuit, preferably in the form of a microcontroller, an application-specific integrated circuit (ASIC) or a digital signal processor.

According to the invention, the control circuit has a single pin P or connection for bidirectional data communication via the reception optocoupler 8 and the transmission optocoupler 9. The reception optocoupler 8 and the transmission optocoupler 9 are connected to the control circuit 10 only via the pin P. Therefore, there is no need for two separate connections for this data communication on the control circuit 10.

The output 8a of the reception optocoupler 8, that is to say the optical receiver of the reception optocoupler 8 which is in the form of a transistor on the output side for example, is connected in series with a first resistor R1. The output 8a of the reception optocoupler 8 is connected to ground. A voltage V1 is applied to the first resistor R1.

A second resistor R2 is connected between the pin P of the control circuit 10 and the connecting point between the reception optocoupler 8 and the first resistor R1.

A series circuit comprising a third resistor R3, a diode D1 and the input 9e of the transmission optocoupler 9, that is to say the optical transmitter of the transmission optocoupler 9 on the input side, is also connected to the pin P. The third resistor R3 is connected to the pin P, in particular. The cathode of the optical transmitter of the transmission optocoupler 9, for example in the form of a light-emitting diode 9L, is connected to ground. Its anode is connected to the cathode of the optional diode D1.

The control circuit internally has a driver T and a comparator K. The comparator K compares the voltage at the pin P with a reference voltage Vref. The pin P is connected to the positive, non-inverting input of the comparator K. The reference voltage Vref is applied to the negative, inverting input of the comparator K. The output signal from the comparator K is denoted IN. The output of the driver T is connected to the pin P, in which case the input signal of the driver T is denoted OUT. A driver voltage VT may be present at the output of the driver T depending on this signal OUT. If, for example, the signal OUT is a logical high signal, the driver T will apply the positive driver voltage VT to the pin P. If, in contrast, the signal OUT is a logical low signal, the driver T will not apply a voltage VT.

According to one exemplary embodiment of the invention, the different components may have the following values:

R1=30·R, where R is a resistance value,
R2=30·R,
R3=R,
V1=3.3 volts,
Vref=1.5 volts, and
VT=3.3 volts.

The diode D1 and the light-emitting diode 9L of the transmission optocoupler 9 may each have the following forward voltages:
VD1=0.7 volts, and
V9L=1.5 volts.

In this case, the diode D1 is only an optional component.

The driver T and the comparator K are preferably internal components of the control and evaluation circuit 10. The reference voltage Vref is also preferably provided by internal components of the control and evaluation circuit 10. The components of the interface 1 which are not internal components of the control and evaluation circuit 10 are preferably fitted to a printed circuit board.

The method of operation of the interface according to the invention is explained below.

In the quiescent state of the DALI bus 4, the bus level is high, as described above. The reception optocoupler 8 will therefore turn on, with the result that the second resistor R2, in particular, is pulled to ground. The ground potential is therefore applied to the pin P, as a result of which the ground potential is also applied to the non-inverted input of the comparator K. The negative input, however, has a positive voltage Vref, with the result that a logical low signal is produced at the output IN of the comparator. The logical low signal at the output IN therefore reflects the fact that the bus 4 is in the quiescent state and the bus level is high.

In the present embodiment, the logical conditions are explained using the DALI bus, in the case of which the bus level is therefore high in the quiescent state. In other protocols, in particular DSI, the quiescent state is characterized by a bus level of zero, with the result that the inverted conditions are then produced.

The reception mode from the point of view of the interface or the operating device is explained below.

If the bus, for example in the form of a DALI bus, transmits, a negative edge is produced, that is to say the bus potential falls from a high level to a low level. After this negative edge, the reception optocoupler 8 is no longer turned on on account of the low level, with the result that the ground potential is also no longer applied to the pin P.

The connection of the resistors is now selected in such a manner that, starting from the voltage supply V1, the voltage now applied to the pin P indeed results in a transmission mode of the light-emitting diode 9L, but the transmission power is too low to turn on the transistor 9T of the transmission optocoupler 9.

At the same time, a signal of 2.2 volts, for example, is now applied to the pin P and therefore to the non-inverted input of the comparator, which produces the high signal at the output IN, which therefore reflects the negative edge in the example of the DALI bus.

This voltage of 2.2 V, for example, at the pin P is produced from the forward voltage VD1=0.7 volts of the diode D1 and the forward voltage V9L=1.5 volts of the light-emitting diode 9L. If the diode D1 were not intended to be provided according to a further exemplary embodiment, a corresponding lower voltage of 1.5 volts, for example, would be produced at the pin P and therefore at the non-inverting input of the comparator K. In order to also obtain the high signal at the output IN in this exemplary embodiment, the reference voltage Vref would have to be reduced to below 1.5 volts.

The transmission mode from the point of view of the interface or the operating device is explained below.

The driver for 3.3 volts, for example, is provided as an internal component in the control circuit 10. If this driver applies 3.3 volts to the pin P and therefore to the third resistor R3, the current produced by the light-emitting diode 9L will be sufficiently high to turn on the transmission optocoupler 9 or its transistor 9T.

There is therefore such asymmetry in the interface 1 that the 3.3 volts from the voltage supply V1 are divided by means of the resistor network consisting of the first and third resistors in such a manner that the transistor 9T of the transmission optocoupler 9 does not turn on, whereas the 3.3 volts from the internal driver T of the ASIC 10 are applied to the transmission optocoupler without such downscaling and therefore result in the optocoupler 9 on the transmission side turning on.

It can be stated that, according to the invention, a voltage is respectively supplied to the transmission optocoupler 9 from the bus, on the one hand, and from an internal driver of the ASIC, on the other hand, but these voltages are supplied using an asymmetrical resistor network.

It is internally ensured in the ASIC that the transmission mode is active via the driver T only when there is currently no evaluation in the comparator on the reception side having the output IN.

Said divider ratio of the asymmetrical connection of resistors has a factor of at least 10, preferably even higher.

REFERENCE SYMBOLS

1 Interface
2 Operating device
3 Lamp
4 Bus
5 Connecting terminals
6 Reception channel
7 Transmission channel
8 Reception optocoupler
8a Output of the reception optocoupler
9 Transmission optocoupler
9e Input of the transmission optocoupler
9L Light-emitting diode of the transmission optocoupler
9T Transistor 9T of the transmission optocoupler
10 Control circuit or control and evaluation circuit

What is claimed is:

1. An interface circuit (1) for an operating device (2) in domestic appliance technology for bidirectionally communicating with a bus (4) via a respective transmission optocoupler (9) and a reception optocoupler (8), said interface circuit comprising:
   a control and evaluation circuit (10) which includes a driver (T) for applying a driver voltage (VT) to a node (P) of the interface circuit (1), which is a connection of the control and evaluation circuit (10), in such a manner that the transmission optocoupler (9) turns on and thus transmits a signal to the bus (4),
   wherein the state of the reception optocoupler (8) is detected at the same node (P), with the result that a signal is received from the bus (4), and
   wherein the control and evaluation circuit (10) comprises a comparator (K), which compares the voltage at the node (P) with a reference voltage (Vref), wherein a low-level signal or a high-level signal on the bus (4) is inferred on the basis of said comparison.

2. The interface circuit as claimed in claim 1, wherein the driver voltage (VT), on the one hand, and a supply voltage (V1) coupled to the reception optocoupler (8), on the other hand, are supplied to the transmission optocoupler (9).

3. The interface circuit as claimed in claim 1, wherein the control and evaluation circuit (10) comprises a driver (T) for applying a driver voltage to the node (P), wherein the driver voltage causes the transmission optocoupler (9) to turn on.

4. An operating device for a lamp, comprising an interface circuit (1) as claimed in claim 1.

5. The interface circuit as claimed in claim 1, wherein a low-level signal on the bus (4) is inferred if the voltage at the node (P) is greater than the reference voltage (Vref), and
a high-level signal on the bus (4) is inferred if the voltage at the node (P) is smaller than the reference voltage (Vref).

6. The interface circuit as claimed in claim 1, wherein the bus (4) is in the form of a DALI bus and a detected high-level signal on the bus (4) is interpreted as a quiescent state of the bus (4).

7. The interface circuit as claimed in claim 1, wherein the control and evaluation circuit (10) is in the form of: a microcontroller, an application-specific integrated circuit (ASIC) or a digital signal processor.

8. The interface circuit as claimed in claim 1, comprising:
a first current path which is connected to the node (P) and has a low-impedance circuit (R3) and the transmission optocoupler (9),
a high-impedance second current path which is connected to the node (P), is supplied with a supply voltage (V1) and is connected to a reception optocoupler (8).

9. The interface circuit as claimed in claim 8, wherein the reception optocoupler (8) is connected to the high-impedance second current path in such a manner that turning-on of the reception optocoupler (8) causes a low potential at the node (P).

10. The interface circuit as claimed in claim 8, wherein the reception optocoupler (8) is connected to the high-impedance second current path in such a manner that the absence of turning-on of the reception optocoupler (8) causes a high potential at the node (P).

11. The interface circuit as claimed in claim 10, wherein the reception optocoupler (8) is connected to the high-impedance second current path in such a manner that the absence of turning-on of the reception optocoupler (8) causes the transmission optocoupler (9) to not turn on.

12. A control and evaluation circuit (10) for an interface circuit (1) for an operating device (2) in domestic appliance technology for bidirectionally communicating with a bus (4) via a respective transmission optocoupler (9) and a reception optocoupler (8), said control and evaluation circuit comprising:
a driver (T) for applying a driver voltage (VT) to a node (P) of the control and evaluation circuit (10), which is a connection of the control and evaluation circuit (10), in such a manner that the transmission optocoupler (9) turns on and thus transmits a signal to the bus (4),
wherein a state of the reception optocoupler (8) is detected at the same node (P), with the result that a signal is received from the bus (4),
wherein the control and evaluation circuit is in the form of: an application-specific integrated circuit (ASIC), a microcontroller or a hybrid version thereof; and
wherein the control and evaluation circuit (10) comprises a comparator (K), which compares the voltage at the node (P) with a reference voltage (Vref), wherein a low-level signal or a high-level signal on the bus (4) is inferred on the basis of said comparison.

13. An interface circuit (1) for an operating device (2) in domestic appliance technology for bidirectionally communicating with a bus (4) via a respective transmission optocoupler (9) and a reception optocoupler (8), said interface circuit comprising:
a control and evaluation circuit (10) which includes a driver (T) for applying a driver voltage (VT) to a node (P) of the interface circuit (1) in such a manner that the transmission optocoupler (9) turns on and thus transmits a signal to the bus (4),
wherein the state of the reception optocoupler (8) is detected at the same node (P), with the result that a signal is received from the bus (4), and wherein the driver voltage (VT), on the one hand, and a supply voltage (V1) coupled to the reception optocoupler (8), on the other hand, are supplied to the transmission optocoupler (9), and an asymmetrical resistor network in such a manner that the transmission optocoupler (9) turns on when the driver voltage (VT) is supplied and the transmission optocoupler (9) does not turn on when the supply voltage (V1) is supplied.

14. An interface circuit (1) for an operating device (2) in domestic appliance technology for bidirectionally communicating with a bus (4) via a respective transmission optocoupler (9) and a reception optocoupler (8), said interface circuit comprising:
a control and evaluation circuit (10) which includes a driver (T) for applying a driver voltage (VT) to a node (P) of the interface circuit (1) in such a manner that the transmission optocoupler (9) turns on and thus transmits a signal to the bus (4),
wherein the state of the reception optocoupler (8) is detected at the same node (P), with the result that a signal is received from the bus (4), wherein, if the driver voltage (VT) is not applied to the node (P), the transmission optocoupler (9) does not turn on and the control and evaluation circuit (10) detect a digital signal received via the reception optocoupler (8) on the basis of the voltage produced at the node (P).

\* \* \* \* \*